United States Patent
del Puerto (10) Patent No.: US 7,025,498 B2
(45) Date of Patent: Apr. 11, 2006

(54) SYSTEM AND METHOD OF MEASURING THERMAL EXPANSION

(75) Inventor: Santiago E. del Puerto, Milton, NY (US)

(73) Assignee: ASML Holding N.V., (NL)

( * ) Notice: Subject to any disclaimer, the term of this patent is extended or adjusted under 35 U.S.C. 154(b) by 0 days.

(21) Appl. No.: 10/448,027

(22) Filed: May 30, 2003

(65) Prior Publication Data

US 2004/0240513 A1 Dec. 2, 2004

(51) Int. Cl.
*G01J 5/08* (2006.01)
*G01B 9/00* (2006.01)

(52) U.S. Cl. .................. 374/44; 374/55; 374/130; 356/500; 356/498; 356/450; 250/200

(58) Field of Classification Search .............. 374/12, 374/43, 44, 55, 208, 104, 130, 6; 438/795; 361/234; 356/500, 351, 358, 363, 399; 33/147
See application file for complete search history.

(56) References Cited

U.S. PATENT DOCUMENTS

| | | | | |
|---|---|---|---|---|
| 3,788,746 A | * | 1/1974 | Baldwin et al. | 356/485 |
| 4,334,778 A | * | 6/1982 | Pardue et al. | 356/486 |
| 4,636,969 A | * | 1/1987 | Kyoden et al. | 702/155 |
| 4,711,574 A | * | 12/1987 | Baldwin | 356/485 |
| 4,930,894 A | * | 6/1990 | Baldwin | 356/485 |
| 4,984,891 A | * | 1/1991 | Miyazaki et al. | 356/500 |
| 5,064,289 A | * | 11/1991 | Bockman | 356/485 |
| 5,220,405 A | * | 6/1993 | Barbee et al. | 356/503 |
| 5,298,970 A | * | 3/1994 | Takamatsu et al. | 356/487 |
| 5,350,899 A | * | 9/1994 | Ishikawa et al. | 219/494 |
| H1370 H | * | 11/1994 | Wolch et al. | 356/491 |
| 5,555,089 A | * | 9/1996 | Dunn et al. | 356/506 |
| 5,561,524 A | * | 10/1996 | Yamasaki et al. | 356/493 |
| 5,574,560 A | * | 11/1996 | Franz et al. | 356/498 |
| 5,645,351 A | * | 7/1997 | Nakata et al. | 374/161 |
| 5,754,403 A | * | 5/1998 | Ozmat et al. | 361/720 |
| 5,944,097 A | * | 8/1999 | Gungor et al. | 165/185 |
| 6,005,333 A | * | 12/1999 | Kaneko et al. | 313/306 |
| 6,020,964 A | * | 2/2000 | Loopstra et al. | 356/500 |
| 6,057,921 A | * | 5/2000 | Yao | 356/500 |
| 6,084,673 A | * | 7/2000 | Van Den Brink et al. | 356/492 |
| 6,169,603 B1 | * | 1/2001 | Takayama | 356/500 |
| 6,285,457 B1 | * | 9/2001 | Ukaji | 356/500 |
| 6,347,458 B1 | * | 2/2002 | Kaczynski | 33/503 |
| 6,404,505 B1 | * | 6/2002 | Matsui | 356/620 |
| 6,504,615 B1 | * | 1/2003 | Abe et al. | 356/511 |
| 6,522,386 B1 | * | 2/2003 | Nishi | 355/52 |
| 6,583,859 B1 | * | 6/2003 | Miyajima et al. | 355/72 |
| 6,653,639 B1 | * | 11/2003 | Novak | 250/491.1 |
| 6,654,660 B1 | * | 11/2003 | Singh et al. | 700/121 |
| 6,704,089 B1 | * | 3/2004 | van der Schaar et al. | 355/53 |
| 6,713,376 B1 | * | 3/2004 | Sugihara | 438/613 |
| 6,721,041 B1 | * | 4/2004 | Tanaka | 355/72 |

(Continued)

FOREIGN PATENT DOCUMENTS

JP 53145475 * 12/1978

(Continued)

*Primary Examiner*—Gail Verbitsky
(74) *Attorney, Agent, or Firm*—Sterne, Kessler, Goldstein & Fox P.L.L.C.

(57) ABSTRACT

A chuck having a high specific stiffness and high thermal conductivity compared to conventional chucks, with an apparatus for measuring thermal expansion in the chuck. High specific stiffness allows for a higher control bandwidth and improved scanning performance. High thermal conductivity enables excellent positioning accuracy because thermal expansion and strain may be accurately measured or predicted, and thus compensated.

14 Claims, 3 Drawing Sheets

U.S. PATENT DOCUMENTS

| | | | |
|---|---|---|---|
| 6,762,826 B1* | 7/2004 | Tsukamoto et al. | 355/72 |
| 6,767,127 B1* | 7/2004 | Paganelli | 374/55 |
| 6,819,433 B1* | 11/2004 | Takai et al. | 356/500 |
| 6,939,036 B1* | 9/2005 | Beck et al. | 374/55 |
| 6,941,669 B1* | 9/2005 | Shivaswamy et al. | 33/502 |
| 2002/0053644 A1* | 5/2002 | Yonekawa | 250/492.1 |
| 2002/0135776 A1* | 9/2002 | Nishi | 356/500 |
| 2002/0136262 A1* | 9/2002 | Feger | 374/55 |
| 2002/0171815 A1* | 11/2002 | Matsuyama et al. | 355/55 |
| 2002/0192939 A1* | 12/2002 | Sugihara | 438/629 |
| 2003/0025893 A1* | 2/2003 | Nishi | 355/53 |
| 2003/0053079 A1* | 3/2003 | Hill | 356/520 |
| 2003/0176079 A1* | 9/2003 | Sogard | 438/758 |
| 2003/0179377 A1* | 9/2003 | Masaki et al. | 356/400 |
| 2004/0080737 A1* | 4/2004 | Jasper et al. | 355/55 |
| 2004/0130690 A1* | 7/2004 | Koren et al. | 355/53 |
| 2004/0145751 A1* | 7/2004 | Binnard | 356/500 |
| 2004/0174511 A1* | 9/2004 | Gui et al. | 355/53 |
| 2004/0257550 A1* | 12/2004 | Kasumi | 355/53 |
| 2004/0263846 A1* | 12/2004 | Kwan | 356/399 |

FOREIGN PATENT DOCUMENTS

JP         2002198307 A  *  7/2002

* cited by examiner

SYSTEM AND METHOD OF MEASURING THERMAL EXPANSION

BACKGROUND OF THE INVENTION

1. Field of the Invention

The present invention is generally directed to semiconductor lithography tools. In particular, the present invention is directed to chucks for precisely holding objects in position within lithography tools, while allowing for greater control system bandwidths.

2. Background

As semiconductor devices grow increasingly smaller, the demands on lithography tools increase. Specifically, chuck position tolerances decrease, which causes demands on the lithography tool positioning control systems to increase. For example, modern semiconductor geometries require chuck tracking and positioning to be accurate to 10 nanometers or better. In the past, chucks have been made from materials with relatively high thermal expansion, such as silicon carbide. These materials successfully met the less stringent requirements of their era without any thermal expansion compensation. Conventionally, however, their use is disfavored.

The state of the art is to manufacture the precision portions of lithographic stages, such as wafer and reticle chucks, from ultra low expansion materials. Conventionally, ultra low expansion materials are used in order to keep the thermal strain low. Low thermal strain is desirable for improving the positioning accuracy of the chuck, which holds a reticle or wafer during scanning operations. This is because uncompensated changes in stage dimensions caused by temperature variations increase positioning uncertainty of the object being scanned. Low thermal strain is also desirable because it reduces thermal distortion of reticles and wafers by constraining them with chucks that expand less than the objects being constrained.

Nonetheless, there are two major problems associated with the material properties of ultra low expansion materials conventionally used for chucks in precision lithographic stages. First, they have mediocre specific stiffness. In other words, they are not very stiff for their density. Eigenfrequencies, or resonant frequencies, of these conventional materials are proportional to the square root of their specific stiffness. The lowest chuck resonant frequency, also known as its fundamental frequency is a limiting factor in selecting the frequency (or bandwidth) of the control system for the lithography tool because a control frequency at or above the chuck's fundamental resonant frequency may cause the chuck to vibrate. This compromises the dynamic performance of critical stage components, and adversely affects overall scanning performance.

Second, ultra low expansion materials have a very low thermal conductivity. As a result, localized heating can occur as heat is not evenly spread through the chuck. Poor heat dissipation limits the amount of heat that can be applied by motors, actuators and the like. Poor heat dissipation also tends to reduce system performance, as heavy cooling and heat shielding components are needed in other moving portions of the stage to prevent heat from affecting the chuck.

It is thus clear that an ultra low expansion material with high specific stiffness and high thermal conductivity would be extremely desirable for making critical components of precision lithographic stages.

BRIEF SUMMARY OF THE INVENTION

The present invention combines a chuck having a high specific stiffness and high thermal conductivity compared to conventional chucks, with an apparatus for measuring thermal expansion in the chuck. High specific stiffness allows for a higher control bandwidth and improved scanning performance. High thermal conductivity enables excellent positioning accuracy because thermal expansion and strain can be accurately measured and/or predicted, and thus compensated.

In accordance with one embodiment of the present invention, an apparatus for compensating and for measuring thermal expansion comprises a pair of encoders comprising corresponding sets of tracks and heads, the tracks being positioned on the chuck, while the heads are positioned on the metrology, or reference frame. The encoder heads measure the displacement of the tracks relative to the reference frame and to each other. This measurement is representative of the thermal displacement of the chuck.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawings in which an element first appears is indicated by the leftmost digit(s) in the corresponding reference number.

DETAILED DESCRIPTION OF THE INVENTION

A. Overview

The present invention is directed to an apparatus and method for precisely positioning objects in lithography tools. The object to be positioned, such as a reticle or a wafer, is constrained by a chuck having certain physical properties. The chuck is then precisely positioned within a lithography tool. As the lithography tool operates, a control system monitors the position and dimensions of the chuck, and makes necessary adjustments so the object held by the chuck remains properly positioned within the lithography tool.

The invention combines a chuck having certain desirable physical properties with a measurement system that enables compensation for thermal effects on the chuck. Such a combination results in certain operational benefits in the lithography tool.

In the present invention, the chuck is made of a material with a high specific stiffness and a high thermal conductivity, when compared to conventional solutions. These physical properties confer a number of performance benefits over lithography tools using conventional chucks, which typically have low thermal conductivity, low specific stiffness, and extremely low coefficients of thermal expansion. For example, selecting a chuck material with high specific stiffness allows the lithography control system to operate at a higher bandwidth, thus improving scanning performance. Selecting a chuck material with high thermal conductivity produces a substantially isothermal chuck in which thermal strain can be easily measured or predicted, and thus compensated.

The present invention also includes an apparatus for measuring or predicting thermal strain on the chuck. A preferred embodiment uses a pair of encoders having tracks mounted to the chuck, and heads mounted to a metrology frame, to measure thermal expansion or contraction of the chuck.

B. Example Environment

Figure 1:
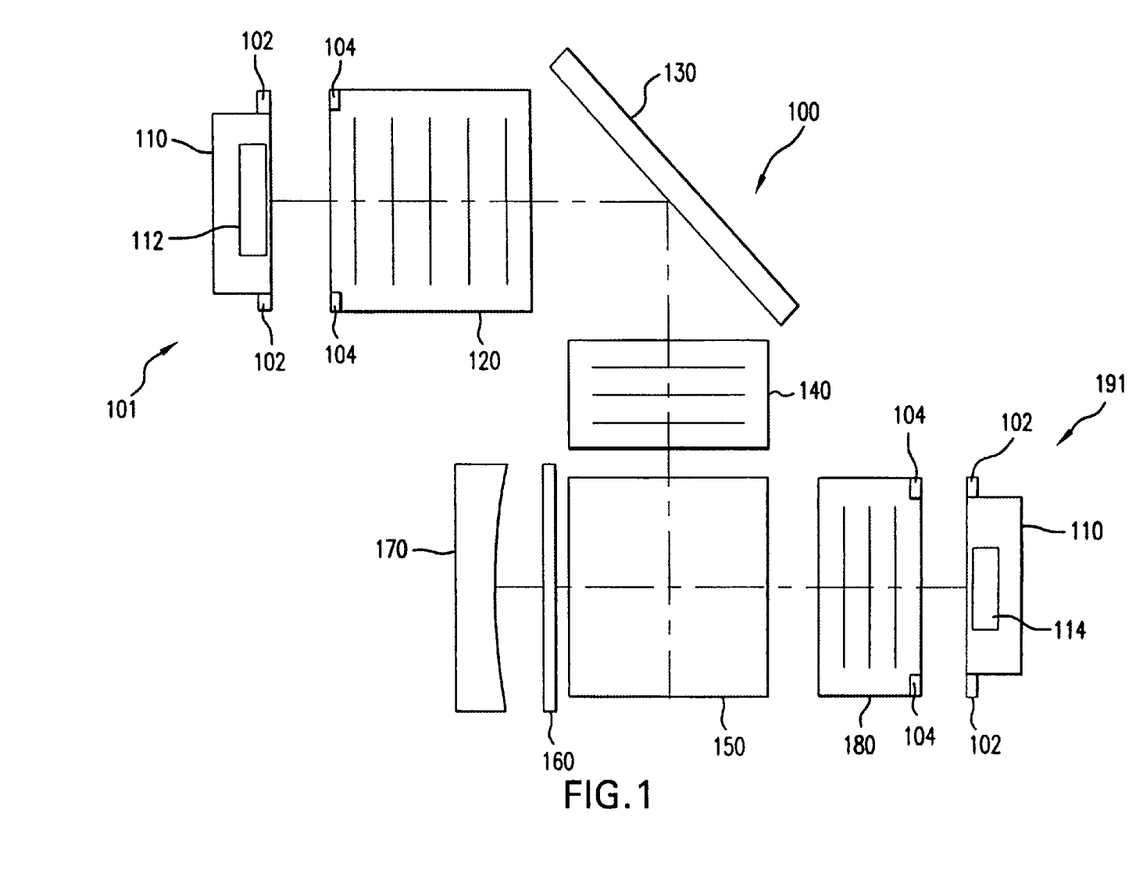
FIG. 1 depicts a typical projection optics system in which the invention is implemented.

At the outset, it is helpful to describe the environment in which the invention may be used. FIG. 1 depicts an example environment in which a chuck 110 according to the present invention may be situated. Apparatus 100 is a conventional projection optics system as may exist in a scanning lithography tool. A reticle stage 101 is followed by a first lens group 120, a folding mirror 130, a second lens group 140, a beam splitter 150 and wave plate 160, a concave mirror 170, a third lens group 180, and a wafer stage 191. A chuck 110 is typically used, for example, to hold a reticle 112 in the reticle stage 101, or a wafer 114 in the wafer stage 191. Chucks may also be used to hold and position other objects, such as mirrors, within a lithography tool. Additionally, chucks according the present invention may be used in lithography tools that do not contain projection optics, such as contact lithography tools, as well as lithography tools with projection optics designs substantially different from this example.

The chuck 110 in FIG. 1 includes a pair of encoder scales 102. Encoder scales 102 are attached along the side of the chuck 110. Lens group 120 has a pair of encoder heads 104 that correspond to the encoder scales 102 of the reticle stage 101. Lens group 180 has a pair of encoder heads 104 that correspond to the encoder scales 102 of the wafer stage. The orientation of the encoder tracks and scales is for illustrative purposes, not limitation. Other orientations and physical arrangements of the elements will become apparent to a person having ordinary skill in the art and without departing from the spirit and scope of the present invention. Operation of the encoders is described more fully below.

Lithography tools typically operate in a relatively thermally stable environment. A typical temperature range for a scanning lithography tool would be between 18 and 22 degrees Celsius, while under steady state scanning conditions, temperature in the chuck itself may vary about plus-or-minus one (+/−1) degree Celsius. Nonetheless, because of the extremely small tolerances of the precision stages (e.g., on the order of 10 nm), even small changes in temperature can cause unintended thermally induced changes in the dimensions of precision stages. Lithography tools also require extremely quiet environments with respect to motion and vibration. This places great demands on scanning and alignment control systems. The extent of control is directly related to system frequency, which is, in turn, directly related to the specific stiffness of the chuck.

C. Chuck Characteristics

As noted above, chuck 110 is fabricated from material having a high specific stiffness and a high thermal conductivity, when compared to conventional chucks. When combined with an apparatus for measuring thermal effects, these properties confer benefits upon the photolithography tool, such as increased control bandwidth, and decreased power consumption. Table 1 provides a useful comparison of several well known materials with both conventional chuck materials, and chuck materials of the present invention.

TABLE 1

Materials Properties Comparison Table

| Material | Density $\rho$ [kg/m3] | Elastic Modulus E [Pa] | Specific Stiffness E/r [(m/s)2] [in millions] | Coefficient of Thermal Expansion $\alpha$ [ppm/K] | Thermal Conductivity k [W/m · K] | Thermal Stability k/$\alpha$ [W/m] |
|---|---|---|---|---|---|---|
| Metals | | | | | | |
| 303 Stainless Steel | 8,028 | 193,100 | 24.05 | 17.28 | 16.27 | 0.94 |
| 6061 Aluminum | 2,713 | 69,000 | 25.43 | 23.40 | 171.37 | 7.32 |
| Ultra-Low Expansion Glass/Ceramics | | | | | | |
| Zerodur (by Schott) | 2,530 | 93,800 | 37.08 | 0.02 | 1.64 | 82.00 |
| ULE 7971 (by Corning) | 2,201 | 67,600 | 30.71 | 0.02 | 1.32 | 66.00 |
| "Technical" Ceramics | | | | | | |
| Silicon Carbide | 3,211 | 466,000 | 145.13 | 2.40 | 250.00 | 104.17 |
| Silicon Nitride | 3,267 | 296,500 | 90.76 | 2.00 | 27.70 | 13.85 |
| Aluminum Nitride | 3,260 | 300,000 | 92.02 | 4.30 | 110.00 | 25.58 |

The features and advantages of the present invention will be better understood with an introduction to some of the parameters disclosed above in Table 1. Specific stiffness is a measure of a materials rigidity divided by the materials density. An object's resonant frequencies or eigenfrequencies are also directly related to the specific stiffness of the material from which it is made. Specifically, resonant frequencies are proportional to the square root of specific stiffness.

In the context of chucks used in lithography tools, specific stiffness is a very important parameter with respect to the operating frequency of the control system. Objects in lithography tools are hyper sensitive to vibration. If the frequency of the control system is at or above the lowest eigenfrequency of the chuck, henceforth the fundamental resonant frequency, then control frequency induced vibration could result. For this reason, the bandwidth of the lithography tool's control system is effectively somewhat less than the fundamental resonant frequency of the chucks. Typically, the chucks are critical limiting factors when choosing the frequency and bandwidth of a control system.

Specific stiffness is also reflective of an object's mass and weight. For instance, aluminum is not as stiff as stainless steel, but because it is much less dense, its specific stiffness is nearly the same as steel. Since rigidity, not strength, is the prevailing requirement of a chuck, an exemplary aluminum chuck would resonate at about the same frequencies as a steel chuck of identical design, but weigh only about a third as much. In general, chucks made from materials with high specific stiffness can be lighter and still meet requirements. In the context of lithography tools, low weight becomes important because a common practice in the design of lithography tools is to isolate the chuck from sources of vibration, for example the floor. Typically, such isolation is accomplished by magnetically and/or hydrostatically (by means of an air bearing) levitating the chuck against the pull of gravity, in order to reduce the physical contact between it and the outside world as much as possible. Lighter chucks require less force to isolate and therefore less powerful levitation means, which cost less to make and operate. In the context of scanning lithography tools, where the chucks are scanned back and forth past a beam of light, low chuck mass also becomes important for achieving high production throughputs. In accomplishing the reciprocating motions of the reticle and wafer, which are typically found in scanning type tools, accelerating and decelerating force is provided by linear motors that drive the chucks. Heavier chucks require larger motors, which cost more to make and operate, and tend to generate more heat.

Specific stiffness is also reflective of an object's mass and weight. For instance, aluminum is not as stiff as stainless steel, but because it is much less dense, its specific stiffness is nearly the same as steel. Since rigidity, not strength is the prevailing requirement of a chuck, an exemplary aluminum chuck would resonate at about the same frequencies as a steel chuck of identical design, but weigh only about a third as much. In general, chucks made from materials with high specific stiffness can be lighter and still meet requirements. In the context of lithography tools, low weight becomes important because a common practice in the design of lithography tools is to isolate the chuck from sources of vibration, for example the floor. Typically, such isolation is accomplished by magnetically and/or hydrostatically (by means of an air bearing) levitating the chuck against the pull of gravity, in order to reduce the physical contact between it and the outside world as much as possible. Lighter chucks require less force to isolate and therefore less powerful levitation means, which cost less to make and operate. In the context of scanning lithography tools, where the chucks are scanned back and forth past a beam of light, low chuck mass also becomes important for achieving high production throughputs. In accomplishing the reciprocating motions of the reticle and wafer, which are typically found in scanning type tools, accelerating and decelerating force is provided by linear motors that drive the chucks. Heavier chucks require larger motors, which cost more to make and operate, and tend to generate more heat.

Thermal conductivity is a measure of how efficiently heat is conducted by the material, while the coefficient of thermal expansion reflects the extent to which a material will expand as it is heated. These two properties combine to provide a measure of overall thermal stability, which is the thermal conductivity divided by the coefficient of thermal expansion.

Certain properties of generally familiar metals, such as stainless steel and aluminum, are provided in Table 1 as reference points. As displayed in Table 1, stainless steel has a specific stiffness of 24.05 $(m/s)^2$, with a thermal conductivity of 16 W/m·K, where W is watts, m is meters, s is seconds and K is degrees Kelvin. Aluminum has a similar specific stiffness, but a much higher thermal conductivity of 171.37 W/m·K.

Conventionally, chucks used in lithography tools are crafted from materials that have an extremely low coefficient of thermal expansion. For example, conventional chucks are commonly made from ultra-low expansion glass/ceramics, such as ZERODUR® by Schott, or ULE 7971® by Corning. These glass/ceramics are characterized primarily by their extremely low thermal conductivity and extremely low coefficient of thermal expansion. Because these ultra-low expansion glass/ceramics are essentially impervious to thermal expansion, they obviate the need to compensate for thermal deformation of the chuck during lithographic operations. Nonetheless, ultra-low expansion glass/ceramics do have significant drawbacks.

First, and most importantly, their low specific stiffness limits the frequency, and thus the bandwidth, of the lithography tool's control system. Second, because of their low thermal conductivity, they are susceptible to localized heating. Finally, these materials are proprietary, expensive and difficult to machine. Newer proprietary ceramic materials, such as Kyocera's Cordierite 210®, having similarly low expansion to ZERODUR® and ULE® with slightly higher specific stiffness, have been created, but their price may remain extremely high for the foreseeable future due to a lack of supplier competition. Reliance on such proprietary, high cost, limited availability materials may be undesirable from a business point of view.

Chucks according to the present invention are fabricated from a class of generally non-proprietary materials called "technical ceramics", also commonly referred to as "advanced ceramics." Technical ceramics have the characteristics shown in Table 1. In a preferred embodiment, the chuck of the present invention is made from Silicon Carbide. As can be seen in Table 1, Silicon Carbide has nearly four times the specific stiffness of ZERODUR® and nearly five times the specific stiffness of ULE 7971®. As noted above, the allowable control bandwidth or frequency of a lithography tool is proportional to the square root of the specific stiffness of the chuck material. Thus, using Silicon Carbide chucks, which have roughly four times (4×) the specific stiffness of conventional chucks, could double the control bandwidth of a lithography tool using conventional chucks made from ZERODUR® or ULE 7971®. However, because Silicon Carbide has a higher coefficient of thermal expansion (2.4 vs 0.02 ppm/K), which must be compensated by the control system, the present invention incorporates a system for measuring any thermal expansion.

Because Silicon Carbide also has a thermal conductivity nearly 200 times that of ZERODUR® or ULE 7971®, while maintaining a relatively low coefficient of thermal expansion, it has a somewhat higher thermal stability. Other technical ceramics listed in the table are not quite as thermally stable as ZERODUR®, but they still fall within an acceptable range. This allows precise measurement or prediction of thermal expansion, thus allowing for precise correction within the tolerances allowed by modern semiconductor fabrication geometries. In essence, low thermal expansion remains desirable, while high thermal conductivity becomes important so that following a thermal perturbation, the object quickly reaches internal thermal equilibrium and a uniform temperature, so that thermal strain becomes uniform rather than localized, and therefore it becomes less relevant how or where on the object expansion is measured. To a large degree, worse than ideal thermal expansion can be compensated for by excellent thermal conductivity.

The next section describes how thermal expansion can be measured according to various embodiments of the invention in order to improve on the naturally good performance of selected non-proprietary materials in order to meet today's stringent lithographic tool performance requirements.

D. Apparatus for Measuring Thermal Compensation

Figure 2:
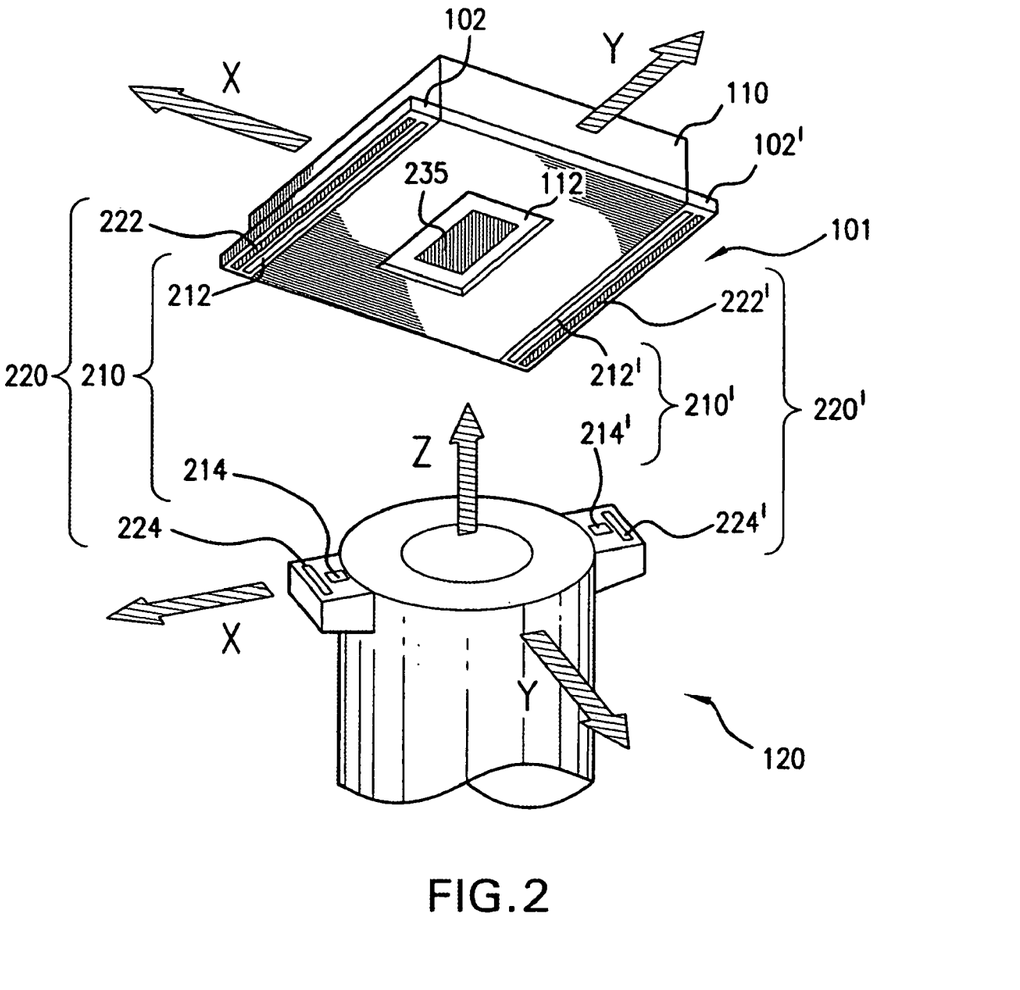
FIG. 2 depicts an embodiment of the invention.

FIG. 2 depicts an exemplary apparatus for measuring thermal compensation in a chuck 110 of the present invention. The apparatus makes use of encoders 220, 220' to measure the thermal expansion or contraction of a chuck 110 having the physical characteristics described above.

The chuck block 101 scans relative to lens 120 along the Y axis. Typically, chuck block 101 has six degrees of freedom, five of which are short translations and small rotations (X, Z, Rx, Ry, and Rz) and one of which is long translation (Y). Reticle 112 has a patterned area 235. Patterned area 235 is to be projected by lens 120 onto a wafer 114. Reticle 112 is mounted on chuck block 101.

In the embodiment depicted in FIG. 2, the chuck 101, and the lens 120 are part of a scanning lithography tool. In a scanning lithography tool, the reticle 112 scans past the light source (not shown). Thus, the reticle 112 and the chuck 110 are moving parts of the lithography tool. In contrast, the lens 120 is mounted to the metrology frame, or reference frame (not shown), of the lithography tool. The reference frame does not move.

As is shown in FIG. 2, scales 102, 102', are positioned along opposite edges of the chuck 110 such that they are aligned substantially parallel to each other and to the Y axis. Each scale includes two sets of tracks 212/222 and 212'/222'. Tracks 212 and 222 correspond to encoder heads 214 and 224. Tracks 212' and 222' correspond to encoder heads 214' and 224'. The encoder heads are part of the reference frame. Y-encoders 220 and 220' measure relative displacements between the heads and the tracks along the Y direction, whereas X-encoders 210 and 210' measure relative displacements between the heads and the tracks along the X direction.

The difference between Y encoders 220 and 220' (i.e., $\Delta Y$), can be used to compute angular rotation Rz of the chuck block 101 about its Z axis. Specifically, Rz equals $\Delta Y$ divided by the distance between the tracks 222 and 222'. The difference between X-encoders (i.e., $\Delta X$) from an initial calibration map performed before applying a thermal load, represent the thermal expansion of the chuck block 101 in the X direction and can be used to compute the thermal strain $\epsilon$ of the chuck. Specifically, $\epsilon$ equals $\Delta X$ divided by the distance between tracks 212 and 212'. Strictly speaking, only the X component of the thermal strain is measured, but because the chuck has high thermal stability, resulting in an internal state near thermal equilibrium at all relevant times, the error made by assuming that the thermal strain in all directions is equal to the value measured in the X direction is acceptably small.

The measured thermal expansion can be used directly to adjust the X tracking for maintaining the chuck block 101 centered relative to the lens 120 in the X direction during scanning despite thermal expansion. Assuming that the chuck expands uniformly, it can also be used to calculate the expansion in the Y and Z directions and adjust the Y positioning and scanning speed, which affects the Y-magnification and overlay capabilities of the lithography tool and the Z tracking, which affects the overall magnification and focus of the projection lens, as it would be apparent to one familiar with the operation of scanning-type lithography tools, accordingly with any thermal expansion.

The two sets of encoders 220, 220' of the above described embodiment can be used in various combinations to measure not only thermal expansion, but also all other displacements of the chuck in the XY plane due to other intentional and unintentional factors such as applied propulsion and control forces and internal or external sources of vibration. In fact, if thermal expansion were the only quantity to be measured, only one set of encoders would be necessary.

One skilled in the art could easily envision alternate means for measuring thermal expansion and thermal strain in the chuck block 101. For example, one encoder track could be positioned along one edge of the chuck. This single encoder track could have two encoder heads positioned at opposite ends of the encoder track. Thermal expansion is determined from the displacement of the first end of the encoder track relative to the second end. Because the high thermal conductivity of the chuck makes the chuck essentially isothermal, one can predict overall thermal expansion by measuring the thermal expansion in just one direction.

Thermal expansion could also be measured using an interferometer. An interferometer uses a beam splitter (e.g., a diagonally split cube) to generate two beams. One beam is used as a reference and the other for measurement. One beam is directed to a mirror on one side of chuck, while the other is directed to a mirror on the opposite side of chuck. The mirrors on the chuck are parallel, but not coplanar. The reflected light off the two mirrors are recombined at the interferometer to determine relative motion, and thus thermal expansion. Ordinarily, one mirror that is coupled to the chuck parallel to the scanning direction is used to keep the chuck in the center of the scanning path, which requires just one beam. With a redundant beam, perpendicular to scanning direction, and a second mirror parallel to the scanning direction but not coplanar with the first mirror, thermal expansion of the chuck on which the mirrors are mounted may be measured.

In yet another embodiment, a retrocube, or retroreflector, may be used. A retroreflector always returns a light beam parallel to the incident direction independent of from where the beam is shining. If the beam is received off axis, then the beam is returned off axis. To measure thermal expansion, one such retroreflector could be positioned at one corner of the chuck, while a second retroreflector could be positioned at an opposite corner. Each retroreflector receives a beam from an interferometer and reflects it back. The interferometer measures the displacement of one retroreflector with respect to the other, and thus measures the thermal expansion of the chuck on which the retro-reflectors are mounted.

Typically, these retroreflectors do not scan past the beam, rather, they move back and forth along the beam to measure the position of the chuck relative to scanning direction, i.e., how far along the scan axis it is. With two retroreflectors that are parallel and coplanar, that is, on adjacent corners of the chuck, one can measure angular rotation in addition to position along the beam. This is the typical set-up of a state of the art stage. However, if the second retroreflector is instead non-coplanar with the first, that is, located on a diagonally opposed corner, one can now measure either rotation or thermal expansion in addition to position. To measure position, rotation and thermal expansion, one would need three beams and three retroreflectors on or near corners of the chuck.

The above described methods are well known methods for measuring chuck position and rotation that have been modified to also measure thermal expansion, and these examples are not limiting. One skilled in the art could implement still more ways to measure thermal expansion or strain using, for example, capacitance gauges, electrically conductive strips and Hall effect devices, or optical proximity sensors as are known in the art. In addition to the said displacement-measuring methods, thermal expansion could be derived from a measurement of the temperature of the chuck at one or more points and knowledge of the coefficient of thermal expansion of the chuck material and chuck dimensions. However, the temperature-measuring method suffers from the general difficulty in making very precise temperature measurements, high sensitivity to the precise location of the measurement point in an object which is almost but not perfectly isothermal, and uncertainties in the measured value of the coefficient of thermal expansion, which may vary slightly from one portion of the chuck to another, and from chuck to chuck. Although straightforward, the temperature-measurement method of thermal expansion calculation would be inherently more error prone than a displacement-measurement method.

Figure 3:
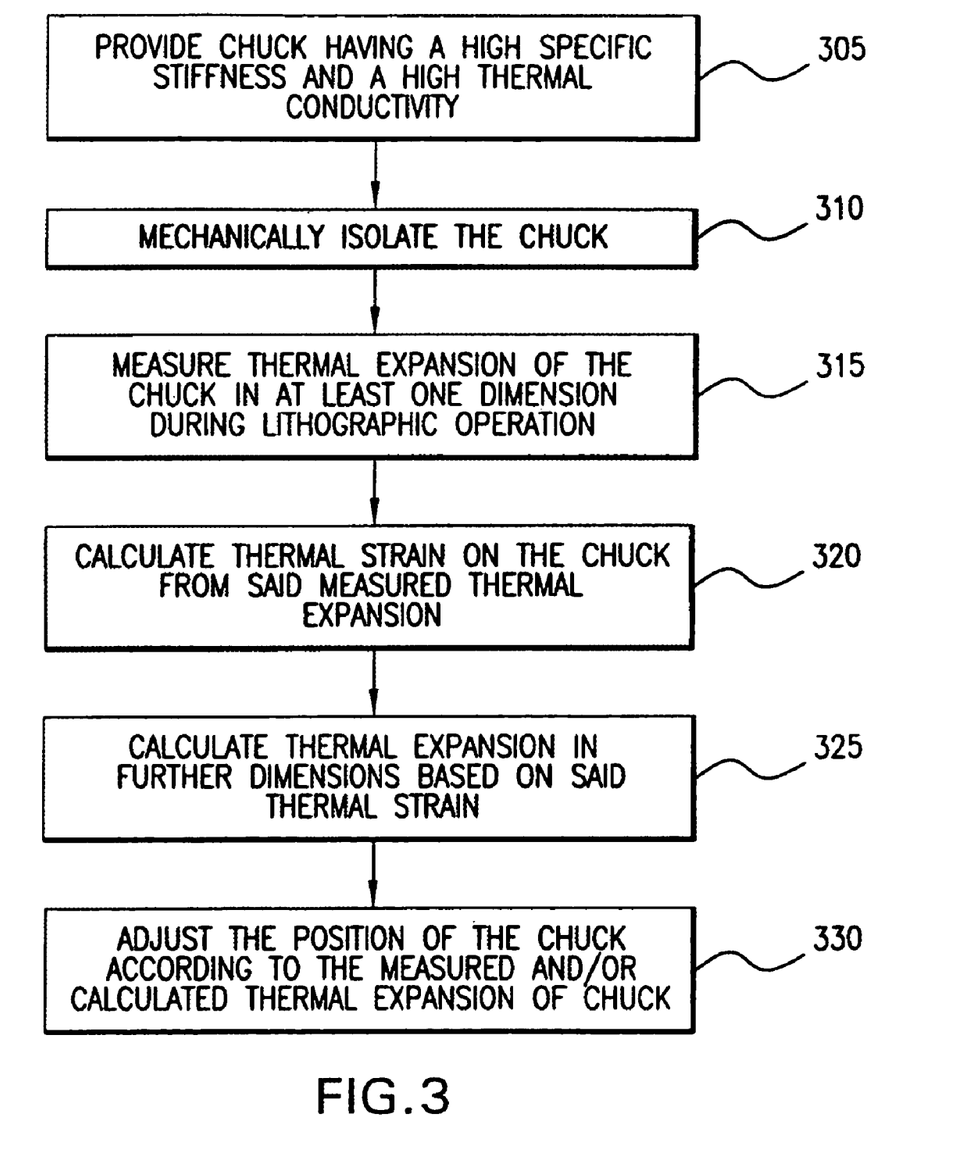
FIG. 3 is a flow diagram of the invention.

FIG. 3 illustrates a method for increasing the bandwidth, or operating frequency, of a lithography tool's control system. In step 305, a chuck is provided that has a high specific stiffness and high thermal conductivity, as described above. These physical characteristics confer benefits on the lithography tool. As described above, a high specific stiffness allows increased bandwidth in the lithography tool's control system, while a high thermal conductivity allows precise measurement of thermal effects on the chuck.

In step 310, the chuck is mechanically isolated. For example, if the chuck is in a stage of a lithography tool, then the chuck can be magnetically and/or hydrostatically levitated within the stage such that it is mechanically isolated from other portions of the stage. Mechanical isolation improves the thermal characteristics of the chuck by making the chuck less susceptible to localized heating caused by mechanical contact with hotter or colder parts of the machine. Even more importantly, it greatly reduces the intensity of externally produced vibration that is transmitted to the chuck. Examples of externally produced vibrations, which plague lithography tools, are floor vibrations and acoustical vibrations, such as those generated by vehicular traffic in nearby highways, people walking near the machine, and compressors, fans, blowers and the like within the machine or building.

In step 315, the thermal expansion of the chuck in at least one preferred dimension is measured. The high thermal conductivity of the chuck causes the chuck to be substantially isothermal.

In step 320, the high thermal conductivity allows precise calculation of thermal strain from a measurement of thermal expansion. In materials with low thermal conductivity, localized heating can occur, making thermal strain non-uniform, thus increasing the error in the calculation of the thermal strain.

To measure thermal strain, the original size of the chuck is measured with the chuck in thermal equilibrium, before any thermal loads are applied to the chuck. The thermal strain in dimension x is then equal to the measured thermal expansion in dimension x divided by the original size in dimension x.

In step 325, the thermal expansion of the chuck in any remaining dimension is calculated from the thermal strain. For example, the thermal expansion in dimension y is equal to the thermal strain (calculated in step 320) multiplied by the original chuck size, as described above, in dimension y. The thermal expansion in dimension x is equal to the measured thermal expansion in dimension x divided by the original size in dimension x.

The thermal strain is assumed to be equal to the average of the calculated thermal strains for all remaining directions. Again, this assumption is valid only for highly conductive, isotropic materials. There are a variety of methods for measuring chuck position that can be adapted to measure thermal effects in the chuck. Some of these methods are described above. In a preferred embodiment, an encoder is used to measure thermal expansion.

In step 330, the position of the chuck is adjusted, if necessary, for any thermal expansion that is detected. A wide variety of methods for positioning the chuck are known in the art.

The above steps, when taken together, allow increased bandwidth in a lithography tool's control system, thus improving overall lithographic performance, such as the ability to produce smaller features within a semiconductor chip layer and more accurate registration of the chip layers to each other.

F. Conclusion

While various embodiments of the present invention have been described above, it should be understood that they have been presented by way of example only, and not limitation. It will be understood by those skilled in the relevant art(s) that various changes in form and details may be made therein without departing from the spirit and scope of the invention as defined in the appended claims. Accordingly, the breadth and scope of the present invention should not be limited by any of the above-described exemplary embodiments, but should be defined only in accordance with the following claims and their equivalents.

What is claimed is:

1. A lithography system having a control system, comprising:
   a stage;
   a chuck, supported by said stage, and having a high specific stiffness and a high thermal conductivity; and
   a means for measuring thermal expansion of said chuck by comparing displacement of at least two positions on opposite sides of said chuck;
   wherein said chuck supports a workpiece or an optical element such that moving said chuck also moves said workpiece or said optical element; and
   wherein said high specific stiffness allows increased frequency of the control system, and wherein said high thermal conductivity produces a substantially isothermal chuck whose thermal expansion may be accurately measured or predicted.

2. The apparatus of claim 1, wherein said chuck is substantially isolated from a projection optics portion of the lithography tool.

3. The apparatus of claim 1, wherein said chuck is magnetically stabilized and positioned.

4. The apparatus of claim 1, wherein said specific stiffness is approximately between 90M and 150M $(m/s)^2$.

5. The apparatus of claim 1, wherein said thermal conductivity is approximately between 25 and 250 W/mK where W is Watts, m is meters, and K is temperature in Kelvin.

6. The apparatus of claim 1, wherein said chuck is made from silicon carbide and its composites.

7. The apparatus of claim 1, wherein said chuck is made from silicon nitride and its composites.

8. The apparatus of claim 1, wherein said chuck is made from aluminum nitride and its composites.

9. The apparatus of claim 1, wherein said means for measuring thermal expansion comprises an interferometer.

10. The apparatus of claim 9, wherein said means of measuring thermal expansion comprises:
    a first flat mirror positioned on said chuck for reflecting a first light beam from said interferometer positioned on a metrology frame of the lithography tool; and
    a second flat mirror parallel to and not coplanar to said first flat mirror, positioned on said chuck for reflecting a second light beam from said interferometer;
    wherein thermal expansion in a direction perpendicular to said mirrors is determined from the displacement of said second mirror relative to said first mirror measured by said interferometer.

11. The apparatus of claim 9, wherein said means of measuring thermal expansion comprises:
    a first retroreflector positioned near a first corner of said chuck for reflecting a first light beam from said interferometer positioned on a metrology frame of the lithography tool; and
    a second retroreflector positioned near a second corner of said chuck that is diagonally opposed to said first corner of said chuck, for reflecting a second light beam parallel to said first beam from said interferometer;
    wherein thermal expansion in a direction parallel to said beams is determined from the displacement of said second retroreflector relative to said first retroreflector as measured by said interferometer.

12. A method for measuring thermal expansion in a lithography tool having a control system, the method comprising:
    supporting a workpiece or an optical element with a chuck, the chuck being supported by a stage and having a high specific stiffness and a high thermal conductivity, such that moving the chuck also moves the workpiece or the optical element;
    determining measures of displacement due to the thermal expasion of at least two positions on opposite sides of the chuck; and
    comparing the measures of displacement between the at least two positions on the opposite sides of the chuck,
    whereby the high specific stiffness of the chuck allows increased frequency of the control system, and whereby the high thermal conductivity of the chuck produces a substantially isothermal chuck whose thermal expansion may be accurately measured or predicted.

13. The method of claim 12, further comprising the step of substantially isolating the chuck from a projection optics portion of the lithography tool.

14. The method of claim 12, further comprising the step of magnetically stabilizing and positioning the chuck.

* * * * *

UNITED STATES PATENT AND TRADEMARK OFFICE
CERTIFICATE OF CORRECTION

PATENT NO.       : 7,025,498 B2                                              Page 1 of 1
APPLICATION NO.  : 10/448027
DATED            : April 11, 2006
INVENTOR(S)      : Santiago E. del Puerto It is certified that error appears in the above-identified patent and that said Letters Patent is hereby corrected as shown below:

In column 5, before line 22, the following paragraph should be inserted:
-- As explained above, control system bandwidth is directly limited by chuck resonant frequency, which is proportional to the square root of specific stiffness. Thus, doubling the specific stiffness of the chuck material will allow an increase in control bandwidth of about 1.4 times (1.4x). Likewise, if the specific stiffness of the chuck material is increased by a factor of four, then the control frequency could double. Therefore, it would be beneficial to have a chuck material with a high specific stiffness. Since a control system can only effectively correct external disturbances (for example transmitted floor vibrations) which have a frequency less than the control bandwidth, an increase in control bandwidth results in fewer uncorrected disturbances, which leads to better lithographic performance. In essence, high specific stiffness enables controls that can effectively suppress the detrimental effect of external disturbances on chuck positioning.--

In column 5, lines 50 thru 67 should be deleted, and in column 6, lines 1 thru 10 should be deleted.

In column 9, before line 40, the heading -- E.    Method for Increasing Bandwidth in a Lithography Tool-- should be inserted.

Signed and Sealed this

Tenth Day of April, 2007

JON W. DUDAS
*Director of the United States Patent and Trademark Office*